United States Patent
Wu et al.

(10) Patent No.: US 9,419,035 B2
(45) Date of Patent: Aug. 16, 2016

(54) IMAGE SENSOR WITH COLOR PIXELS HAVING UNIFORM LIGHT ABSORPTION DEPTHS

(75) Inventors: Fei Wu, Los Gatos, CA (US); Hongjun Li, San Jose, CA (US); Yin Qian, Milpitas, CA (US); Hsin-Chih Tai, San Jose, CA (US); Howard E. Rhodes, San Martin, CA (US); Jizhang Shan, Cupertino, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 377 days.

(21) Appl. No.: 13/344,312

(22) Filed: Jan. 5, 2012

(65) Prior Publication Data

US 2012/0104525 A1    May 3, 2012

Related U.S. Application Data

(63) Continuation-in-part of application No. 12/029,400, filed on Feb. 11, 2008, now Pat. No. 8,097,890.

(51) Int. Cl.
*H01L 27/146* (2006.01)
*G02B 3/00* (2006.01)

(52) U.S. Cl.
CPC ........ *H01L 27/14627* (2013.01); *G02B 3/0018* (2013.01); *H01L 27/1464* (2013.01); *H01L 27/14685* (2013.01)

(58) Field of Classification Search
None
See application file for complete search history.

(56) References Cited

U.S. PATENT DOCUMENTS

| | | | |
|---|---|---|---|
| 6,429,036 B1 | 8/2002 | Nixon et al. | |
| 6,660,988 B2 | 12/2003 | Lee et al. | |
| 7,262,448 B2 | 8/2007 | Kim | |
| 2002/0162943 A1 | 11/2002 | Lee et al. | |
| 2003/0025160 A1 | 2/2003 | Suzuki et al. | |
| 2005/0280012 A1 | 12/2005 | Boettiger et al. | |
| 2006/0114570 A1 | 6/2006 | Ozawa | |
| 2006/0278948 A1* | 12/2006 | Yamaguchi et al. | 257/444 |
| 2008/0007839 A1 | 1/2008 | Deng et al. | |
| 2008/0128843 A1* | 6/2008 | Lee | 257/432 |
| 2008/0237761 A1* | 10/2008 | Fu et al. | 257/432 |
| 2009/0034083 A1* | 2/2009 | Li et al. | 359/619 |

* cited by examiner

*Primary Examiner* — Matthew W Such
*Assistant Examiner* — Abul Kalam
(74) *Attorney, Agent, or Firm* — Blakely Sokoloff Taylor & Zafman LLP

(57) ABSTRACT

An example image sensor includes first, second, and third micro-lenses. The first micro-lens is in a first color pixel and has a first curvature and a first height. The second micro-lens is in a second color pixel and has a second curvature and a second height. The third micro-lens is in a third color pixel and has a third curvature and a third height. The first curvature is the same as both the second curvature and the third curvature and the first height is greater than the second height and the second height is greater than the third height, such that light absorption depths for the first, second, and third color pixels are the same.

9 Claims, 9 Drawing Sheets (not to scale)

(not to scale)

(not to scale)

(not to scale)

(not to scale)

IMAGE SENSOR WITH COLOR PIXELS HAVING UNIFORM LIGHT ABSORPTION DEPTHS

REFERENCE TO PRIOR APPLICATION

This application is a continuation-in-part of U.S. application Ser. No. 12/029,400, filed Feb. 11, 2008, titled IMAGE SENSOR WITH MICRO-LENSES OF VARYING FOCAL LENGTHS.

BACKGROUND

1. Field

Embodiments of the present invention relate to image sensors and, in particular, to micro-lenses for image sensors.

2. Discussion of Related Art

In general, conventional image sensors perform well to generate images. A typical image sensor may be fabricated from a complementary metal oxide semiconductor (CMOS) technology. Charge coupled device (CCD) technology is also suitable.

A typical image sensor includes an array of picture elements or pixels. An individual pixel is made up of a photodetector, one or more light filters, and a micro-lens. The typical image sensor operates as follows. Light such as visible light, which is made up of several different colors of light, is incident on the micro-lens. The micro-lens focuses the light to the photodetector through the light filter. The photodetector converts the light into an electrical signal proportional to the intensity of the light detected. Conventional image sensors suffer from some limitations, however. For example, the response of one pixel to a specific color may be better or worse than the pixel's response to another color.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF EMBODIMENTS

In the below description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

According to some embodiments of the present invention, a complimentary metal oxide semiconductor (CMOS) image sensor may have an array of pixels. At least two pixels may have a micro-lenses disposed therein. The heights of the micro-lenses may be different from each other. Alternatively, the shapes of the micro-lenses may be different from each other. Alternatively still, the focal lengths of the micro-lenses may be different from each other. One advantage of having an image sensor that has micro-lenses with varying shapes, heights, curvatures, and/or focal lengths according to embodiments of the present invention is that the responsiveness of one pixel to a particular color (e.g., black white, grays, red, blue green, etc.) may be improved while the responsiveness of the other pixel to another color also may be improved. That is, pixels can be tailored to respond to particular colors. Embodiments of the present invention use a gray scale mask to tailor the pixels to the particular color. Other features and advantages of the present invention will be apparent from the accompanying drawings and from the detailed description that follows.

Figure 1:
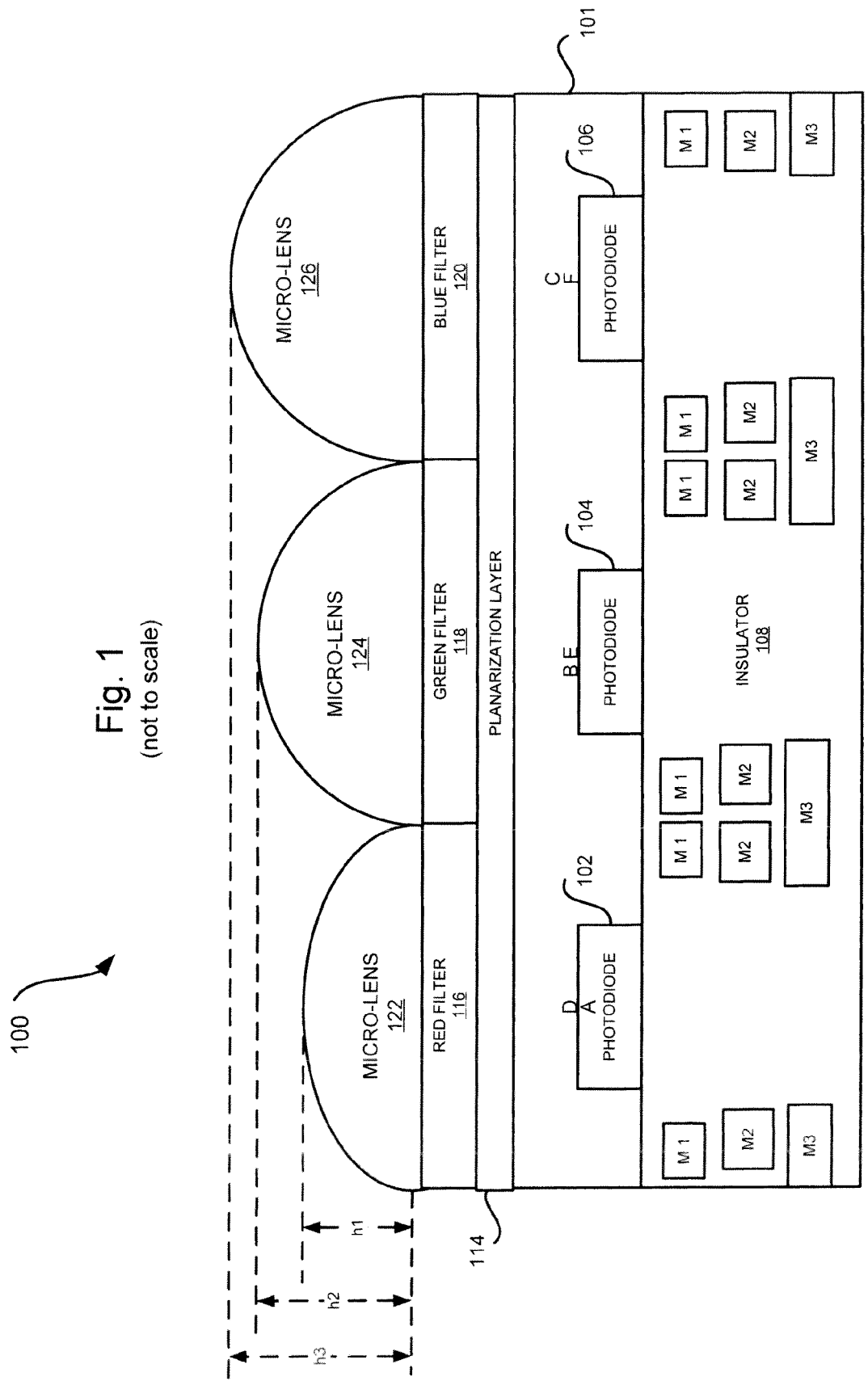
FIG. 1 is a side view of an image sensor that has micro-lenses of varying heights, shapes, curvatures, and/or focal lengths according to an embodiment of the present invention.

FIG. 1 is a side view of an image sensor 100 that has micro-lenses of varying heights, shapes, and/or focal lengths according to an embodiment of the present invention. Generally, the image sensor 100 includes several photosensitive elements arranged in an array of two dimensional rows and columns in a substrate 101.

In the illustrated embodiment, there are three photosensitive elements, which are shown as photodiodes 102, 104, and 106. Of course, the array can include upwards of thousands of rows and/or columns, or more. Similarly, the array may have an arrangement other than columns and rows.

On one side of the substrate 101, several metal conductors M1, M2, and M3 are disposed in an insulator 108. A planarization/passivation layer 114 is disposed on another side of the substrate 101. Several filters shown as a red filter 116, a green filter 118, and a blue filter 120 are disposed on the planarization/passivation layer 114. A micro-lens 122 is disposed on the red filter 116, a micro-lens 124 is disposed on the green filter 118, and a micro-lens 126 is disposed on the blue filter 120.

For some embodiments, the refraction of the micro-lenses 122, 124, and/or 126 varies with the wavelength of incident light. The wavelength of red light is greater than the wavelength of green light, which is greater than the wavelength of blue light. Thus, when white light passes through lenses, blue light is refracted more than green light and red light is refracted more than green light. If the micro-lenses 122, 124, and/or 126 were the same shape, height, and had the same focal lengths, red light may be incident on the photodiode 102 at a point A, green light may be incident on the photodiode 104 at a point B, and blue light may be incident on the photodiode 106 at a point C. These points are not necessarily optimal for detecting light.

According to embodiments of the present invention, the micro-lenses 122, 124, and/or 126 have different shapes, heights, and/or focal lengths. As a result, red light may be incident on the photodiode 102 at a point D, green light may be incident on the photodiode 104 at a point E, and blue light may be incident on the photodiode 106 at a point F. These points may be better for detecting the light.

For some embodiments, the focal length f of the micro-lens 122 is smaller than the focal length of the micro-lens 124, which is smaller than the focal length of the micro-lens 126. Among other things, the colors or peak wavelengths of the filters 116, 118, and 120, the thicknesses of the micro-lenses 122, 124, and 126, the radius of curvature for the surface of the micro-lens where light is incident on the micro-lenses 122, 124, and 126, etc., may determine the focal length of a particular micro-lenses 122, 124, and 126. For some embodiments, the thickness of a micro-lens may be in the range of approximately 0.3 to 3.0 micrometers.

In the illustrated embodiment, the micro-lens 122 has a height h1, the micro-lens 124 has a height h2, and the micro-lens 126 has a height h3. Note that h3 is greater than h2, which is greater than h1. During fabrication, the heights or thicknesses of the micro-lenses 122, 124, and 126 are determined based on the desired focal lengths for the micro-lenses 122, 124, and 126. That is, the different heights result in different focal lengths for the micro-lenses 122, 124, and 126. In the illustrated embodiment, the micro-lenses 122, 124, and 126 also have different shapes, which are determined based on, among other things, the desired focal lengths.

Because the micro-lenses 122, 124, and 126 have different shapes, heights, and/or focal lengths, more red light may fall on the pixel made up of the photodiode 102, the red filter 116, and the micro-lens 122. Similarly, more green light may fall on the pixel made up of the photodiode 104, the green filter 118, and the micro-lens 124. Likewise, more blue light may fall on the pixel made up of the photodiode 106, the blue filter 120, and the micro-lens 126. That is, each pixel may be tailored to respond its associated color or peak wavelength.

For some embodiments, the substrate 101 may be a semiconductor substrate. For some embodiments, the substrate 101 is a doped silicon substrate.

For some embodiments, the photosensitive elements 102, 104, and 106 may be any suitable device that converts light into an electric signal. The photosensitive element may be a photodiode as shown or other solid state device. Other photosensitive elements also may be utilized as well.

For some embodiments, the dielectric material 108 may be any suitable insulator such as an oxide. For some embodiments, the dielectric material may be a silicon oxide.

For some embodiments, the M1, M2, and M3 metal conductors may be copper, aluminum, an aluminum-copper mixture, or other metal suitable for carrying a signal. The dielectric material 108 may insulate the M1, M2, and M3 metal conductors from each other and the substrate 101.

For some embodiments, the planarization/passivation layer 114 may protect or planarize the substrate 101.

In the illustrated embodiment, the filter 116 is a red filter that substantially allows red light to pass but blocks substantially all other light in the visible spectrum, the filter 118 is a green filter that substantially allows green light to pass but blocks substantially all other light in the visible spectrum, and the filter 120 is a blue filter that substantially allows blue light to pass but blocks substantially all other light in the visible spectrum. Although the filters are shown as a red filter 116, a green filter 118, and a blue filter 120, they need not be these colors. The filters 116, 118, and/or 120 may be cyan, magenta, and/or yellow. Other colors are suitable as well. The filters 116, 118, and 120 may be made from any suitable material. One suitable material for the filters 116, 118, and/or 120 is an acrylic. Polymethylmethacrylate (PMMA) or polyglycidylmethacrylate (PGMA) that has been pigmented or dyed is suitable for embodiments in which the filters are color filter. Other photoresist-type materials that can be dyed or pigmented may also be used.

Although shown as color filters, the filters 116, 118, and/or 120 need not be. For some embodiments, the filters 116, 118, and/or 120 may be filters for black and white photography.

Figure 2:
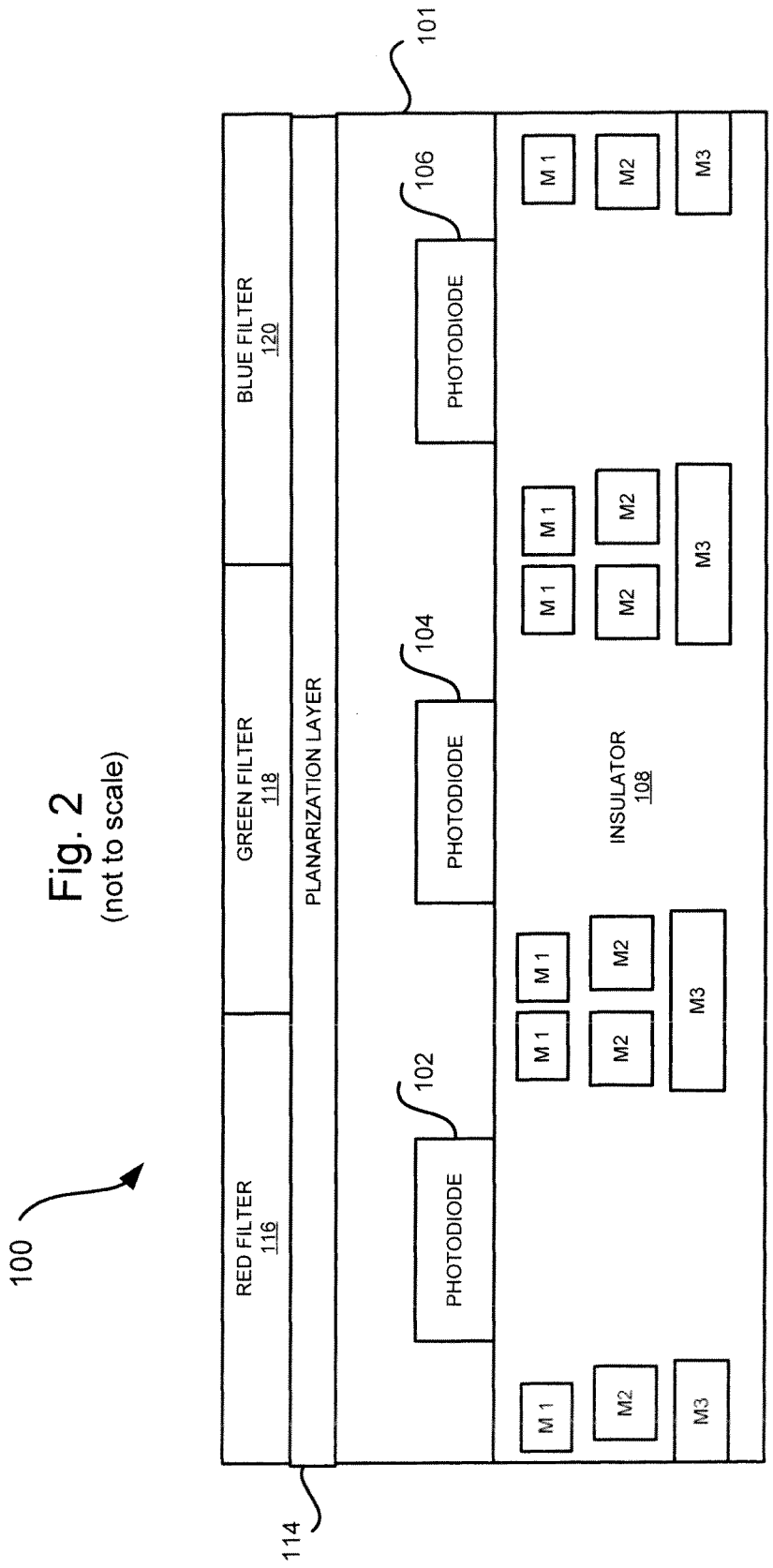
FIG. 2 is a side view of the image sensor in FIG. 1 undergoing a fabrication process according to an embodiment of the present invention.

Fabrication of the image sensor 100 according to at least one embodiment will now be described with reference to FIG. 2 through FIG. 5. The embodiment shown in FIG. 2 shows a first step in the fabrication process. For example, FIG. 2 is a side view of the image sensor 100 without the micro-lenses 122, 124, and 126 according to an embodiment of the present invention.

The illustrated embodiment shows/illustrates the photodiodes 102, 104, and 106; the metal conductors M1, M2, and M3 are disposed in the insulator 108; the planarization/passivation layer 114 is disposed on the insulator 108; and the red filter 116, green filter 118, and blue filter 120 are disposed on the planarization/passivation layer 114. Techniques for fabricating the image sensor 100 depicted in FIG. 2 are known and include deposition, etching, masking, implantation, growing, photolithography, etc.

Figure 3:
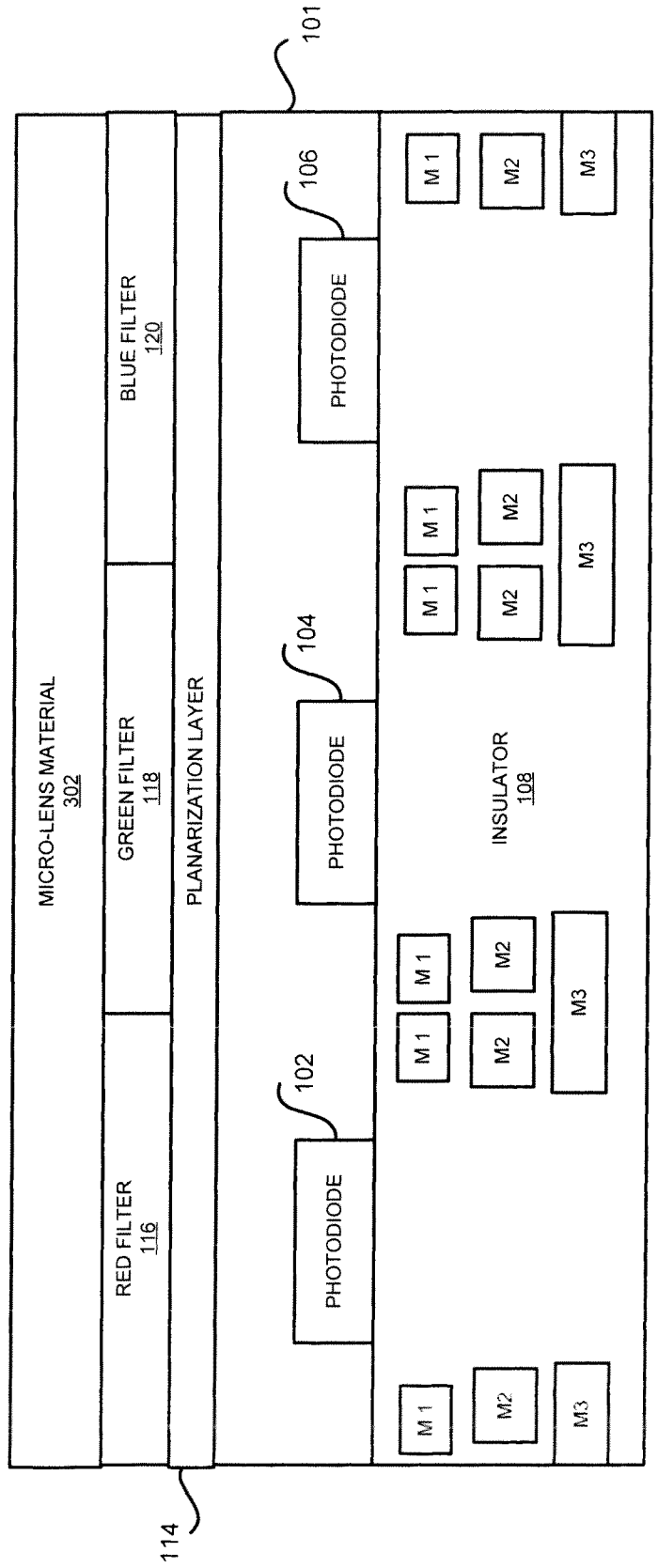
FIG. 3 is a side view of the image sensor in FIG. 1 undergoing a fabrication process according to an embodiment of the present invention.

The embodiment shown in FIG. 3 shows a next step in the fabrication process. For example, FIG. 3 is a side view of the image sensor 100 with micro-lens material 302 disposed on the filters 116, 118, and 120. For some embodiments, the micro-lens material 302 may be disposed using spin-on techniques, blanket deposition techniques, or other methods suitable for disposing the micro-lens material 302 in a substantially planar manner.

The micro-lenses material 302 may be any suitable material. One suitable material is an acrylic. Polymethylmethacrylate (PMMA) or polyglycidylmethacrylate (PGMA) also may be used. Other photoresist-type materials may also be used.

Figure 4:
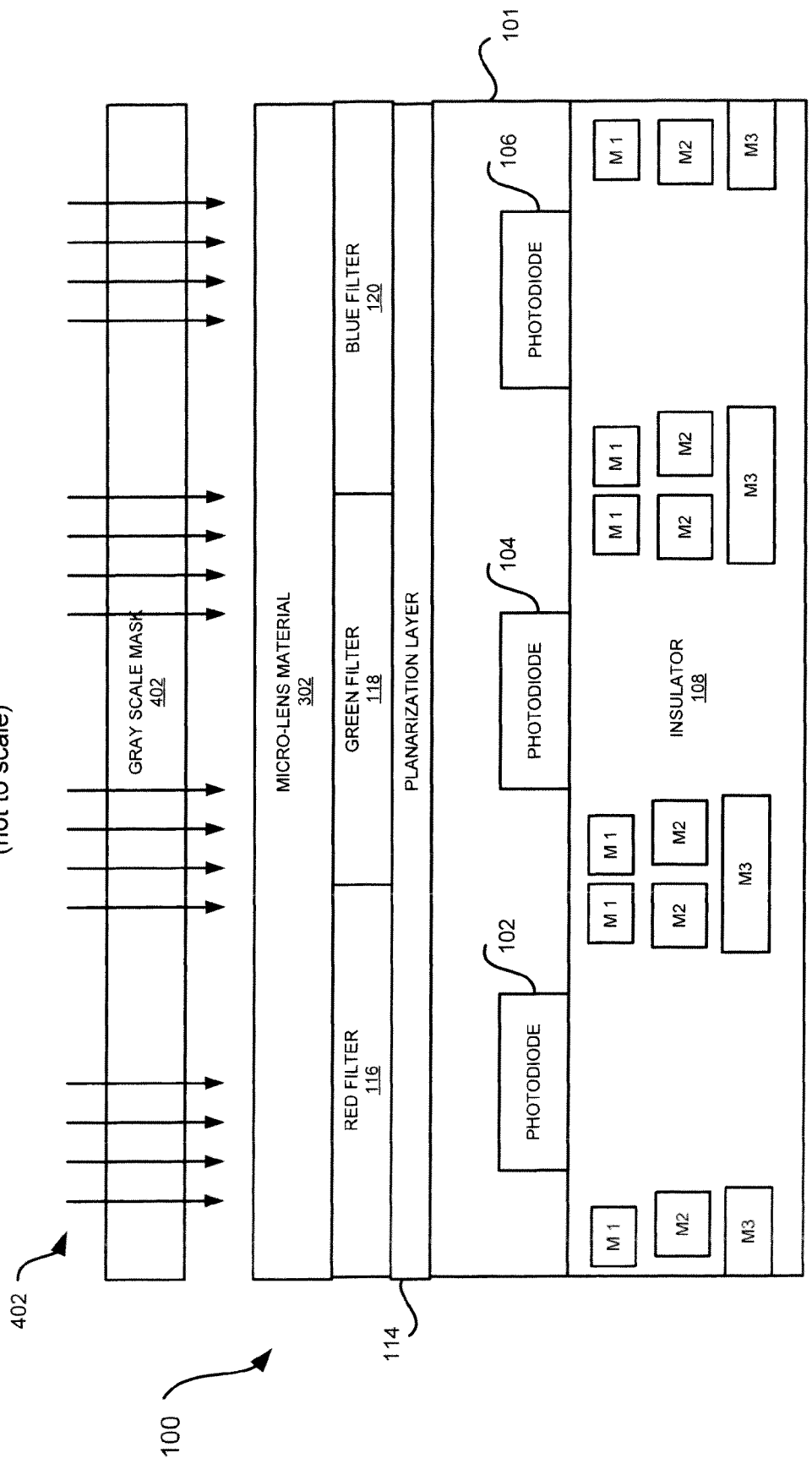
FIG. 4 is a side view of the image sensor in FIG. 1 undergoing a fabrication process according to an embodiment of the present invention.

The embodiment shown in FIG. 4 shows a next step in the fabrication process. For example, FIG. 4 is a side view of the image sensor 100 with micro-lens material 302 being exposed to a source 402 through a gray scale mask 404 according to an embodiment of the present invention. The source 402 and the gray scale mask 404 are used to pattern the micro-lens material 302 into blocks of micro-lens material in a single exposure.

In embodiments in which the source 402 is ultraviolet light and the micro-lens material 302 is a positive photoresist, the portion of the micro-lens material 302 that is exposed to source 402 becomes soluble to the micro-lens material 302 developer and the portion of the micro-lens material 302 that is unexposed remains insoluble to the micro-lens material 302 developer. In embodiments in which the source 402 is ultraviolet light and the micro-lens material 302 is a negative photoresist, the portion of the micro-lens material 302 that is exposed to the source 402 becomes relatively insoluble to the micro-lens material 302 developer. The unexposed portion of the micro-lens material 302 is dissolved by the micro-lens material 302 developer.

For some embodiments, using the gray scale mask 404 allows the thickness of the micro-lens material 302 that remains after exposure to the source 402 and developing to vary due to the varying transmissiveness of the gray scale mask 404. The thickness of the remaining micro-lens material 302 at a given location may depend on the transmissiveness of the gray scale mask 404 at that location.

Figure 5:
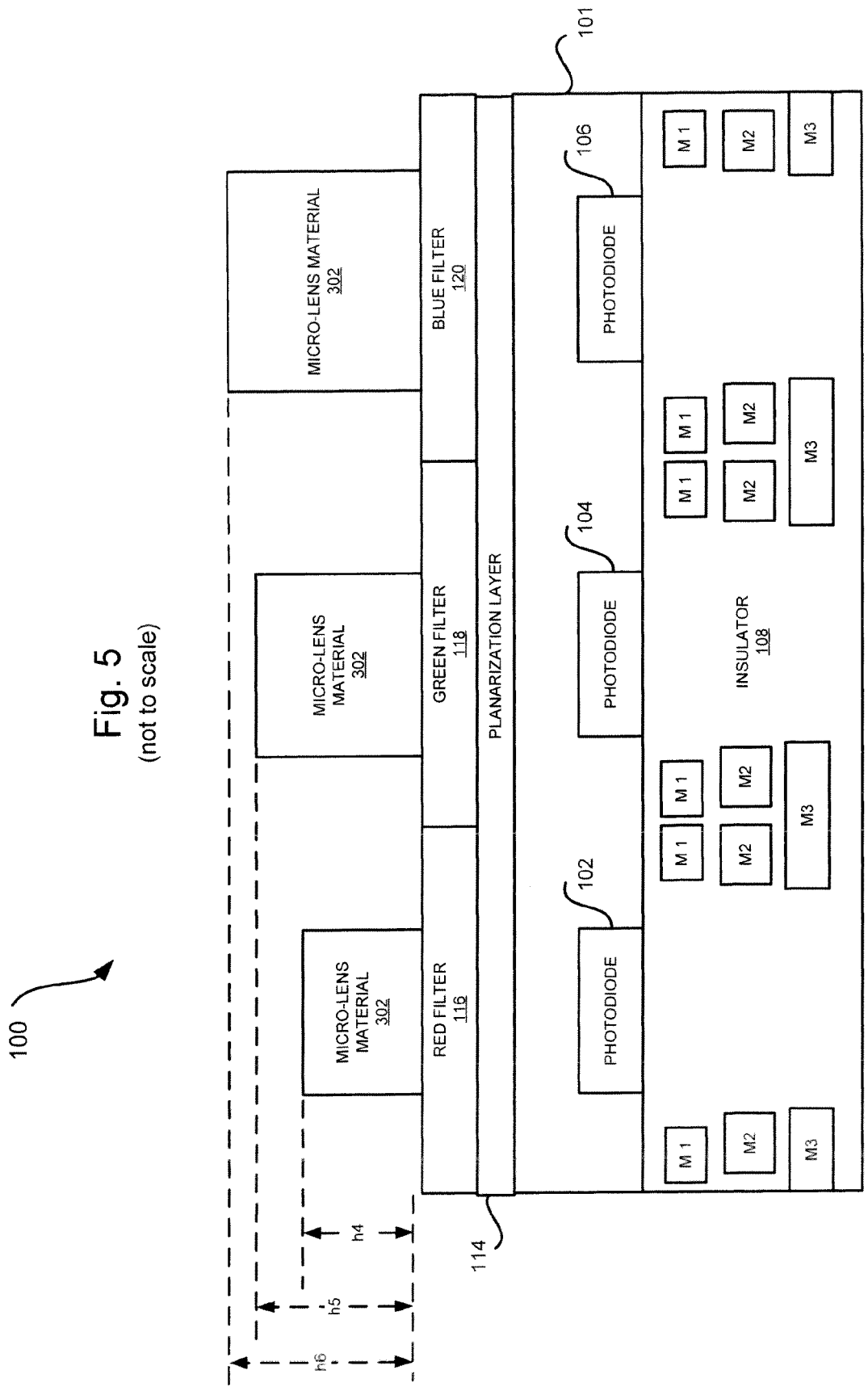
FIG. 5 is a side view of the image sensor in FIG. 1 undergoing a fabrication process according to an embodiment of the present invention.

The embodiment shown in FIG. 5 shows a first step in the fabrication process. For example, FIG. 5 is a side view of the image sensor 100 following exposure and developing of the micro-lens material 302 using the source 402 and the gray scale mask 404 according to an embodiment of the present invention. In the illustrated embodiment, the micro-lens material 302 over the red filter 116 has a height h4, the micro-lens material 302 over the green filter 118 has a height h5, and the micro-lens material 302 over the blue filter 120 has a height h6. Note that h6 is greater than h5, which is greater than h4.

According to embodiments of the present invention, once the micro-lens material 302 is patterned and developed, the remaining micro-lens material 302 may be heated. The micro-lens material 302 may reflow, forming a curvature on the micro-lens material 302. The curvature of the micro-lens material 302 may be different for the micro-lens material 302 over the red filter 116, the micro-lens material 302 over the green filter 118, and the micro-lens material 302 over the blue filter 120. This is because the micro-lens material 302 over the red filter 116 has the height h4, the micro-lens material 302 over the green filter 118 has the height h5, and the micro-lens material 302 over the blue filter 120 has the height h6. After reflow, the result may be the micro-lens 122 having the height h1, the micro-lens 124 having the height h2, and the micro-lens 126 having the height 128, as illustrated in FIG. 1.

Alternatively, the curvature of the micro-lens material 302 may be the same for the micro-lens material 302 over the red filter 116, the micro-lens material 302 over the green filter 118, and the micro-lens material 302 over the blue filter 120, but their heights may be different after reflow processing. The different heights also may be tailored to the particular color to be processed by the photosensitive element.

In the embodiment illustrated in FIG. 1, the micro-lenses 122, 124, and 126, the filters 116, 118, and 120, and the planarization/passivation layer 114, are on one side of the substrate 101 and the M1, M2, and M3 metal conductors disposed in the insulator 108 are on another side of the substrate 101. This embodiment may be referred to as a back side illumination (BSI) embodiment. In back side illumination, light does not go through the metal conductors M1, M2, and M3 before reaching the photodiodes 102, 104, and 106. That is, light paths to the points D, E, and F the photodiodes 102, 104, and 106, respectively, do not include the metal layers.

One advantage of back side illuminated image sensors is that as the image sensors become more complex more metal layers may be added without increasing the length of the optical path to the photodetectors. Additionally, the metal conductors in the metal layers may be spaced closer together without substantially affecting the optical path to the photodetectors.

Figure 6:
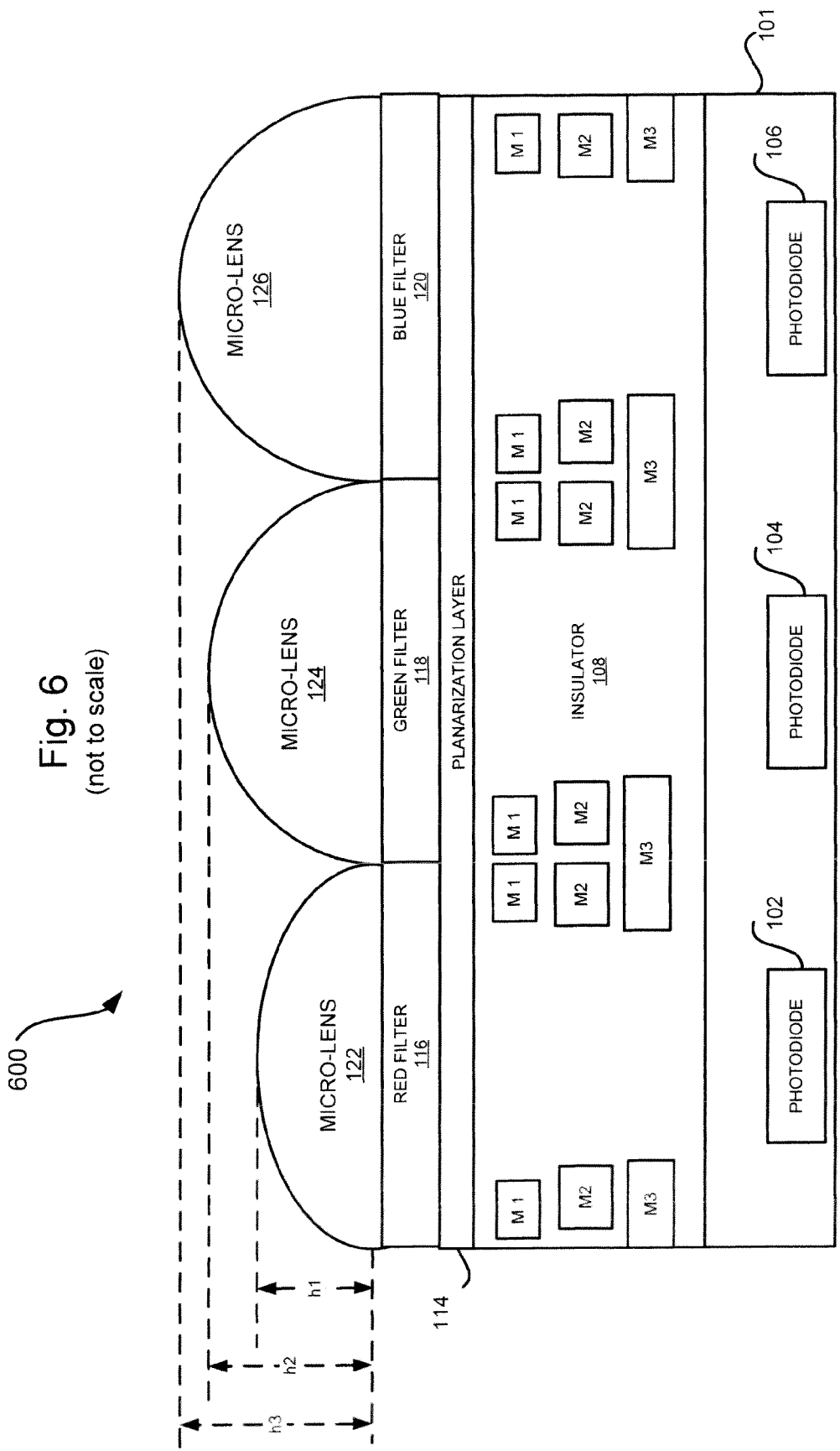
FIG. 6 is a side view of an image sensor that has micro-lenses of varying heights, shapes, curvatures, and/or focal lengths according to an alternative embodiment of the present invention.

FIG. 6 is a side view of an image sensor 600 that has micro-lenses of varying heights, shapes, curvatures, and/or focal points according to an alternative embodiment of the present invention in which the image sensor 600 is front side illuminated (FSI). In the embodiment illustrated in FIG. 1, the micro-lenses 122, 124, and 126, the filters 116, 118, and 120, and the planarization/passivation layer 114, are on one side of the substrate 101 and the M1, M2, and M3 metal conductors disposed in the insulator 108 are on another side of the substrate 101. Although illustrated with the same heights h1, h2, and h3, the heights of the microlenses 122, 124, and 126 may be different.

Figure 7:
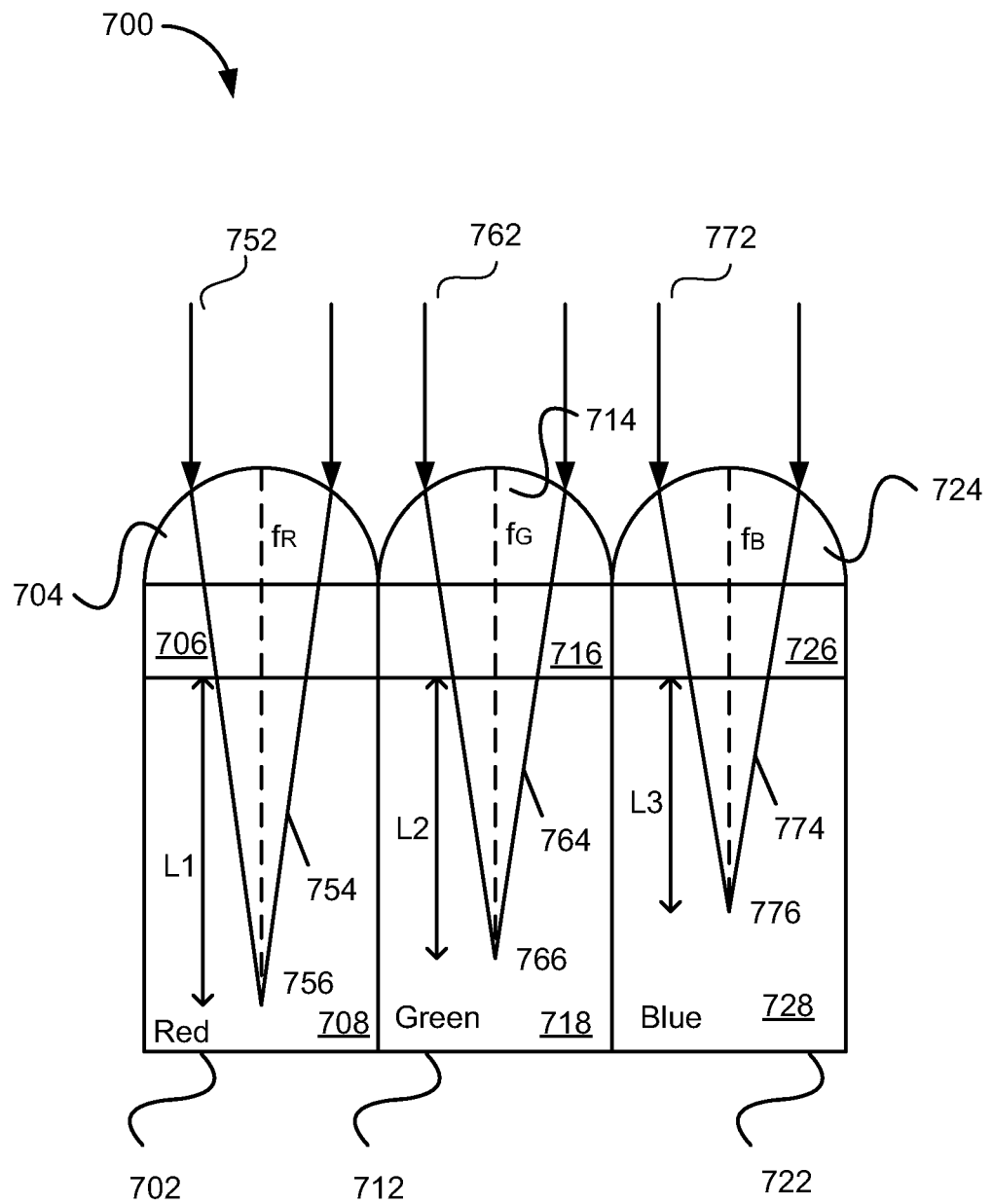
FIG. 7 is a side view of an image sensor with varying light absorption depths.

FIG. 7 illustrates an image sensor 700 having microlenses of the same height and curvature for each of the color pixels (e.g., 702, 712, and 722). For example, red pixel 702 includes a microlens 704, a red color filter 706, and a light sensitive element (e.g., photodiode) 708. Green pixel 712 includes a microlens 714, a green color filter 716, and a light sensitive element 718. Blue pixel 722 includes a microlens 724, a blue color filter 726, and a light sensitive element 728. Microlenses 704, 714, and 724 are identical in that they have the same height, curvature, and may be made from the same material (i.e., same index of refraction). However, image sensor 700 may have some deficiencies. For example, visible incoming light 752 is focused by microlens 704 and filtered by red color filter 706. Filtered light 754 has a center wavelength corresponding to red color. Light 754 is focused in light sensitive element 708. Light 754 travels a distance L1 in light sensitive element 708 to reach its focus 756. If light 754 is not completely absorbed in distance L1, the remaining part of light 754 diverges from focus 756 and may escape from red pixel 702 to neighboring pixels of different colors.

To improve light absorption or quantum efficiency, microlens 704 may be designed to have focus 756 at a depth that light 754 is completely absorbed in distance L1. The focal length of a lens depends on the wavelength of light. A longer wavelength has a longer focal length. Consequently, $f_R > f_G > f_B$, where $f_R$ is the red focal length, $f_G$ is the green focal length, and $f_B$ is the blue focal length. Thus, for microlenses 704, 714, and 724, red focus 756 is deeper than green focus 766, and green focus 766 is deeper than blue focus 776. Consequently, green light 764 and blue light 774 may not be absorbed completely at their respective focal points although red light 754 is absorbed completely, because distance L3 is less than distance L2, and distance L2 is less than distance L1. This may cause low quantum efficiency, crosstalk, and color imbalance. Note that a substrate and/or a planarization/passivation layer may be disposed between color filters and light sensitive elements (e.g., photodiodes) as illustrated in FIG. 1.

Figure 8:
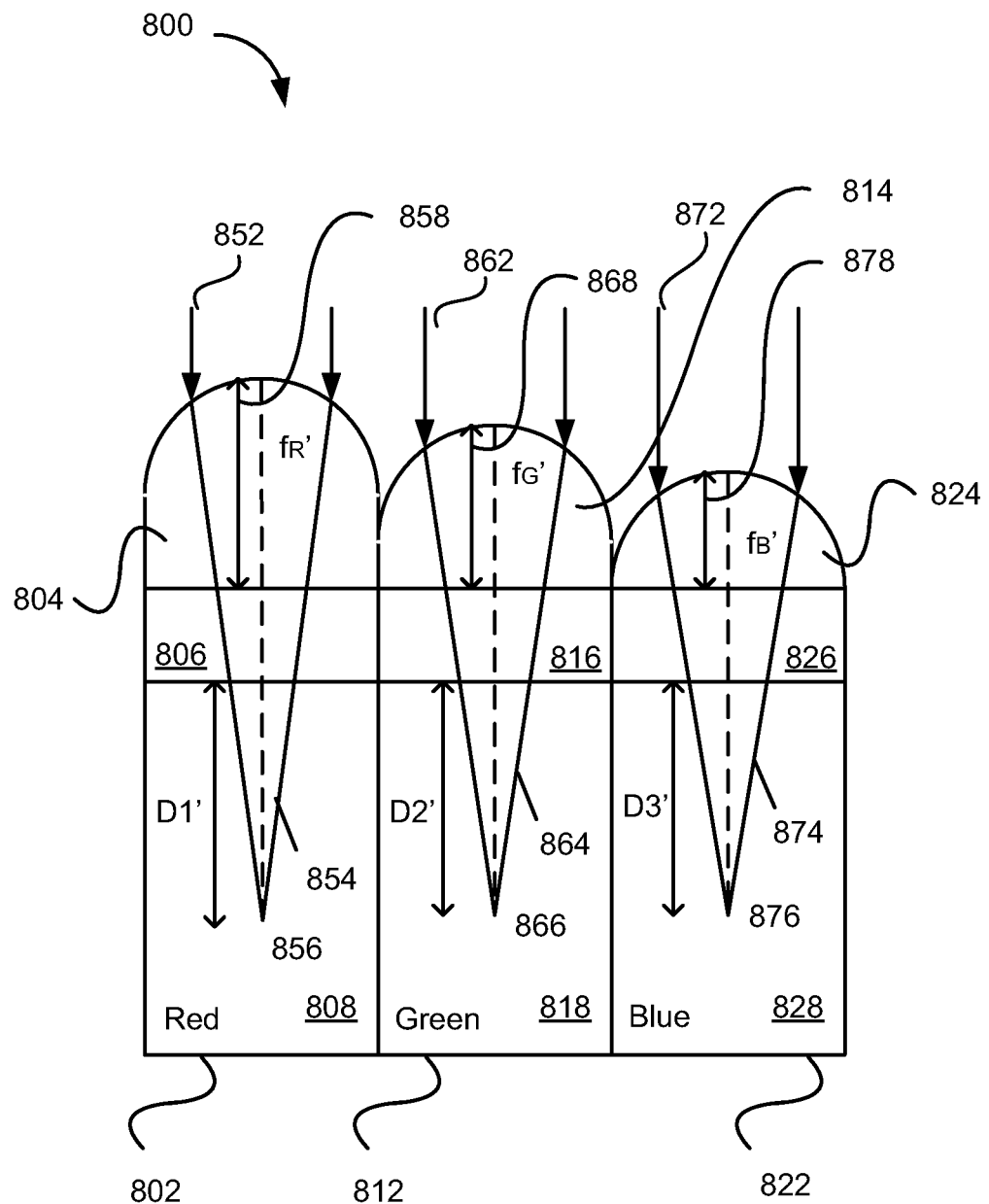
FIG. 8 is a side view of an image sensor that has micro-lenses of varying heights, in accordance with an embodiment of the present invention.

FIG. 8 shows an embodiment 800, in which all microlenses have the same curvature. Thus, the focal lengths of microlenses are approximately the same as those in FIG. 7. In other words, $f_R' \approx f_R$, $f_G' \approx f_G$, and $f_B' \approx f_B$, where $f_R'$, $f_G'$, and $f_B'$ are new focal lengths according to the embodiment illustrated in FIG. 8, and $f_R$, $f_G$, and $f_B$ are focal lengths illustrated in FIG. 7. Microlenses 804, 814, and 824 have a uniform curvature, where the "curvature of a lens" refers to the amount by which the lens deviates from being flat. However, microlenses 804 and 814 are elevated to adjust the positions of focus relative to the light sensitive elements. For example, microlens 804 of red pixel 802 has a height 858 that is greater than the height 868 of microlens 814 of green pixel 812, and height 868 is greater than the height 878 of microlens 824 of blue pixel 822. In other words, height 858>height 868>height 878. In one embodiment, heights 858, 868, and 878 refer to the distance from their color filter to a uppermost point of their respective microlenses. Microlenses 804, 814, and 824 may be fabricated using a gray scale mask as described in previous paragraphs.

Although all microlenses 804, 814, and 824 have approximately unchanged focal lengths relative to FIG. 7, red focus 856 from incoming light 852, green focus 866 from incoming light 862, and blue focus 876 from incoming light 872 have a uniform depth because microlenses 804 and 814 have been elevated accordingly. In other words, light paths 854, 864, and 874 in light sensitive elements 808, 818, and 828 travel the same distance, D1'=D2'=D3' to reach focus 856, 866, and 876, respectively. In one embodiment, depths D1', D2', and D3' are the total light absorption depths for their respective pixels, where substantially all of the received light has been absorbed by their respective light sensitive elements in the distances D1', D2', and D3'. In some instances, all foci may be at the bottom of light sensitive elements. Note that a substrate and/or a planarization/passivation layer may be disposed between color filters and light sensitive elements (e.g., photodiodes) as illustrated in FIG. 1.

Alternatively, the microlenses may be fabricated to have different shapes or curvatures, so the microlenses will have different focal lengths. A layer of photoresist type microlens material is exposed to a light source through a gray scale mask. Only a single exposure is required. Parts of microlens layer that are more exposed to light corresponding to the parts of the gray scale mask having higher transmissiveness will have larger thickness or less thickness depending on whether the layer is a negative or positive photoresist. Similarly, parts of microlens layer that are less exposed to light corresponding to the parts of the gray scale mask having lower transmiveness will have less thickness or larger thickness depending on whether the layer is a negative or positive photoresist. A positive photoresist is a type of photoresist in which the portion of the photoresist that is exposed to light becomes soluble to the photoresist developer. The portion of the photoresist that is unexposed remains insoluble to the photoresist developer. A negative photoresist is a type of photoresist in which the portion of the photoresist that is exposed to light becomes insoluble to the photoresist developer. The unexposed portion of the photoresist is dissolved by the photoresist developer. Thus, a microlens having a certain curvature or shape can be manufactured by developing the exposed positive photoresist or negative photoresist. The curvature or shape of microlens is according to a pattern of varying transmissiveness of the gray scale mask.

Figure 9:
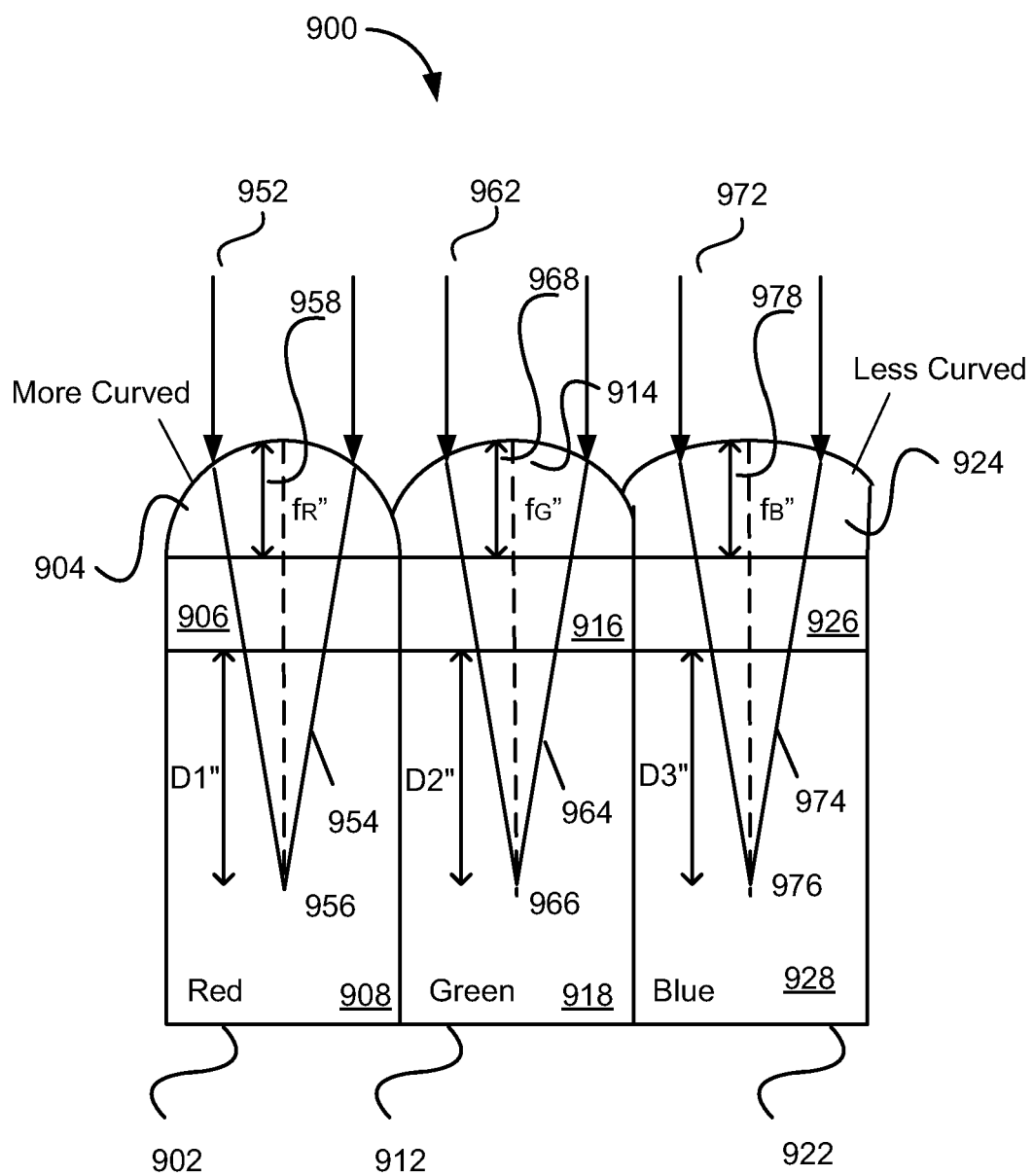
FIG. 9 is a side view of an image sensor that has micro-lenses of varying curvatures, in accordance with an embodiment of the present invention.

FIG. 9 shows an embodiment 900, in which microlenses have different curvatures and approximately the same heights (e.g., height 958=height 868=height 978). Accordingly, $f_R'' \neq f_R$, $f_G'' \neq f_G$, and $f_B'' \neq f_B$, where $f_R''$, $f_G''$, and $f_B''$ are new focal lengths shown in FIG. 9, and $f_R$, $f_G$, and $f_B$ are focal lengths illustrated in FIG. 7. For example, microlens 904 of red pixel 902 is more curved than microlens 914 of green pixel 912, and microlens 914 is more curved than microlens 924 of blue pixel 922. Thus, light paths 954, 964, and 974 in light sensitive elements 908, 918, and 928 travel a uniform distance, D1"=D2"=D3" to reach focus 956, 966, and 976, respectively. In one embodiment, depths D1", D2", and D3" are the total light absorption depths for their respective pixels, where substantially all of the received light has been absorbed by their respective light sensitive elements in the distances D1", D2", and D3". Microlenses 904, 914, and 924 may be fabricated using a gray scale mask as described in previous paragraphs. In some instances, all focus may be at the bottom of light sensitive elements. Note that a substrate and/or a planarization/passivation layer may be disposed between color filters and light sensitive elements (e.g., photodiodes) as illustrated in FIG. 1.

In some instances, a light sensitive element has a spectral response. For example, light sensitive element may be Si-epi. In Si-epi, blue light is absorbed faster than green light, and green light is absorbed faster than red light. In other words, at the same intensity, red light will be completely absorbed in a distance D1, green light will be completely absorbed in a distance D2, and blue light will be completely absorbed in a distance D3, wherein D1 is larger than D2, and D2 is larger than D3 (D1>D2>D3). Accordingly, in a embodiment of FIG. 8 where light sensitive elements are Si-epi, D1'>D2'>D3' may be preferred, where D1", D2", and D3" are distances of red, green and blue light paths in light sensitive elements, respectively. Therefore, the height 858 of red microlens 804 may be less than the height 868 of green microlens 814, and the height 868 of green microlens 814 may be less than the height 878 of blue microlens 824. Also, in contrast to FIG. 9, a red microlens may be less curved than the green microlens, and the green microlens less curved than the blue microlens.

Embodiments of the present invention may be implemented using hardware, software, or a combination thereof. In implementations using software, the software or machine-readable data may be stored on a machine-accessible medium. The machine-readable data may be used to cause a machine, such as, for example, a processor (not shown) to perform the method and processes herein. A machine-readable medium includes any mechanism that may be adapted to store and/or transmit information in a form accessible by a machine (e.g., a computer, network device, personal digital assistant, manufacturing tool, any device with a set of one or more processors, etc.). For example, a machine-readable medium includes recordable and non-recordable media (e.g., read only (ROM), random access (RAM), magnetic disk storage media, optical storage media, flash devices, etc.).

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An image sensor, comprising:
a first micro-lens positioned on a first color filter that is optically coupled to a first light-sensitive element, the first micro-lens having a first curvature and a first height;
a second micro-lens positioned on a second color filter that is optically coupled to a second light-sensitive element, the second micro-lens having a second curvature and a second height; and
a third micro-lens positioned on a third color filter that is optically coupled to a third light-sensitive element, the third micro-lens having a third curvature and a third height;
wherein the first micro-lens, the second micro-lens, and the third micro-lens are made of a single layer of the same material,
wherein the first curvature is the same as both the second curvature and the third curvature, wherein the first height is greater than the second height and the second height is greater than the third height, such that light absorption depths in the first, second, and third light-sensitive elements are the same, and wherein the first, second, and third color filters have the same thickness, and
wherein the first color filter is disposed on the first light-sensitive element, the second color filter is disposed on the second light-sensitive element, and the third color filter is disposed on the third light-sensitive element.

2. The image sensor of claim 1, wherein the first color filter is red, the second color filter is green, and the third color filter is blue.

3. The image sensor of claim 1, wherein the each of the first, second, and third micro-lenses comprise photoresist, and wherein
the first height corresponds to a first transmissiveness at a first location of a gray scale mask;
the second height corresponds to a second transmissiveness at a second location of the gray scale mask; and
the third height corresponds to a third transmissiveness at a third location of the gray scale mask, wherein the first transmissiveness, the second transmissiveness, and the third transmissiveness are different from each other.

4. The image sensor of claim 3, wherein the first, the second, and the third micro-lenses are patterned by the gray scale mask in a single exposure.

5. A backside-illuminated image sensor comprising:
a substrate having a front side and a back side, the front side having formed therein a first light-sensitive element, a second light-sensitive element, and a third light-sensitive element;
first, second, and third color filters formed on the back side of the substrate so that the first color filter is optically coupled to the first light-sensitive element, the second color filter is optically coupled to the second light-sensitive element, and the third color filter is optically coupled to the third light-sensitive element; and
first, second, and third micro-lenses positioned on the first, second, and third color filters, wherein the first micro-lens has a first curvature and a first height, the second micro-lens has a second curvature and a second height, and the third micro-lens has a third curvature and a third height and wherein the first micro-lens, the second micro-lens, and the third micro-lens are made of a single layer of the same material;
wherein the first curvature is the same as both the second curvature and the third curvature, wherein the first, second, and third color filters have the same thickness, and wherein the first height is greater than the second height and the second height is greater than the third height, such that light absorption depths in the first, second, and third light-sensitive element are the same.

6. The image sensor of claim 5, further comprising a planarizing layer formed between the back side of the substrate and the first, second, and third color filters.

7. The image sensor of claim 5 wherein the first color filter is red, the second color filter is green, and the third color filter is blue.

8. The image sensor of claim 5 wherein the first, second, and third micro-lenses are patterned by the gray scale mask in a single exposure.

9. An image sensor comprising:
a first micro-lens positioned on a first color filter that is optically coupled to a first light-sensitive element, the first micro-lens having a first curvature and a first height;
a second micro-lens positioned on a second color filter that is optically coupled to a second light-sensitive element, the second microlens having a second curvature and a second height; and
a third micro-lens positioned on a third color filter that is optically coupled to a third light-sensitive element, the third micro-lens having a third curvature and a third height;
wherein the first micro-lens, the second micro-lens, and the third micro-lens are made of a single layer of the same material;
wherein the first curvature is the same as both the second curvature and the third curvature, wherein the first height is greater than the second height and the second height is greater than the third height, and wherein the first, second, and third color filters have the same thickness;
wherein the first color filter is disposed on the first light-sensitive element, the second color filter is disposed on the second light-sensitive element, and the third color filter is disposed on the third light-sensitive element;
wherein the first, second, and third light sensitive elements each include epitaxial silicon;
wherein the first light sensitive element is configured to receive blue light along a first light path having a first distance within the first light sensitive element, the second light sensitive element is configured to receive green light along a second light path having a second distance within the second light sensitive element, and the third light sensitive element is configured to receive red light along a third light path having a third distance within the third light sensitive element, wherein the third distance is greater than the second distance, and wherein the second distance is greater than the first distance; and
wherein substantially all of the received blue light is completely absorbed in the first distance, substantially all of the received green light is completely absorbed in the second distance, and substantially all of the received red light is completely absorbed in the third distance.

* * * * *